(12) United States Patent
Briggs et al.

(10) Patent No.: US 8,039,318 B1
(45) Date of Patent: Oct. 18, 2011

(54) SYSTEM AND METHOD FOR ROUTING SIGNALS BETWEEN SIDE-BY-SIDE DIE IN LEAD FRAME TYPE SYSTEM IN A PACKAGE (SIP) DEVICES

(75) Inventors: Randall Don Briggs, Boise, ID (US); Michael David Cusack, Meridian, ID (US)

(73) Assignee: Marvell International Technology Ltd., Hamilton (BM)

( * ) Notice: Subject to any disclaimer, the term of this patent is extended or adjusted under 35 U.S.C. 154(b) by 0 days.

(21) Appl. No.: 12/621,377

(22) Filed: Nov. 18, 2009

Related U.S. Application Data

(63) Continuation of application No. 11/416,840, filed on May 3, 2006, now Pat. No. 7,629,675.

(51) Int. Cl.
*H01L 21/00* (2006.01)

(52) U.S. Cl. ........ 438/123; 438/124; 438/107; 257/666; 257/698; 257/723

(58) Field of Classification Search .................. 257/666, 257/698, 723, E23.031; 438/123, 124, 107, 438/109, 110
See application file for complete search history.

(56) References Cited

U.S. PATENT DOCUMENTS

| | | | |
|---|---|---|---|
| 4,916,519 A | 4/1990 | Ward | |
| 5,198,965 A | 3/1993 | Curtis et al. | |
| 5,838,603 A | 11/1998 | Mori et al. | |
| 6,602,735 B2 * | 8/2003 | Shyu | 438/111 |
| 7,157,790 B2 | 1/2007 | Beauchamp et al. | |
| 2003/0201529 A1 | 10/2003 | Jeong et al. | |

* cited by examiner

*Primary Examiner* — Thinh T Nguyen

(57) ABSTRACT

An integrated circuit includes a first and a second die positioned on a lead frame of a package. The lead frame includes a plurality of bond fingers. The integrated circuit includes a first bond pad on the first die that is electrically interconnected to a corresponding second bond pad on the second die through first and second bond fingers of the lead frame. The package may be a QFP, DIP, PLCC, TSOP, or any other type of package including a lead frame.

12 Claims, 4 Drawing Sheets

SYSTEM AND METHOD FOR ROUTING SIGNALS BETWEEN SIDE-BY-SIDE DIE IN LEAD FRAME TYPE SYSTEM IN A PACKAGE (SIP) DEVICES

CROSS-REFERENCES TO RELATED APPLICATIONS

This present application is a continuation of U.S. application Ser. No. 11/416,840 filed May 3, 2006 titled, "SYSTEM AND METHOD FOR ROUTING SIGNALS BETWEEN SIDE-BY-SIDE DIE IN LEAD FRAME TYPE SYSTEM IN A PACKAGE (SIP) DEVICES." The specification of said application is hereby incorporated in its entirety, except for those sections, if any, that are inconsistent with this specification.

BACKGROUND OF THE INVENTION

Integrated circuits or electronic chips are ubiquitous, being contained in many electronic devices used by a person during a typical day, such as in cellular telephones, personal computers, automobiles, and even common household appliances like toasters. A chip includes a semiconductor die, which is made of semiconductor material such as silicon, and in which desired electronic circuitry is formed. For example, a memory chip is a chip containing a die in which electronic circuitry is formed for storing and retrieving data. A chip also includes a package that houses the die and includes pins that provide for electrical interconnection of the chip to external electronic components. Various different types of packages are utilized for chips, with the specific type of package being determined by numerous factors such as required heat dissipation, the physical size of the chip, and the number of interconnections needed from the die to external electronic components. Common packages for chips include dual in-line packages (DIPs), plastic leaded chip carriers (PLCC), Thin Small Outline Packages (TSOPs), pin-grid arrays (PGAs), ball-grid arrays (BGAs), and quad flat packs (QFPs).

In some situations, more than one die is housed in a given package to form what is commonly referred to as a "system in a package" (SIP) device or simply a SIP. The two or more die in this situation must be electrically interconnected, and depending on the type of package this interconnection may present difficulties. Specifically, difficulties arise when using any type of package including a lead frame, such as the DIP, PLCC, TSOP, and QFP packages previously mentioned. For example, a quad-flat pack (QFP) is a package having pins or external leads that project from all four sides of the package. QFP packages are relatively cheap and also are relatively thin (i.e., have a small height) compared to other types of packages, and accordingly may be utilized where cost and height of the package are of concern. A QFP package includes a lead frame and the physical structure of the lead frame and overall QFP package makes the interconnection of multiple dies in such a package problematic.

FIG. 1 is a simplified top view of a portion of a chip including a conventional QFP package containing a lead frame 100. The lead frame 100 includes a die paddle 102 on which two die 104 and 106 are mounted, with the die 104 being a dynamic random access memory (DRAM) and the die 106 being a memory controller in the example of FIG. 1. The die paddle 102 is supported by four support arms 108 (commonly called tie bars) attached to respective corners of the die paddle. Arranged around the periphery of the die paddle 102 are a number of bond fingers 110, several of which are shown along the top, bottom, left, and right edges of the paddle. These bond fingers 110 typically extend from all four sides of the QFP package to form the external leads of the QFP and are also coupled or connected through respective bonding wires 112 to corresponding bond pads 114 on one of the dies 104 and 106. The die paddle 102, bond fingers 110, bonding wires 112, and bond pads 114 are all formed from electrically conductive material, such as a metal, as will be appreciated by those skilled in the art. To simplify FIG. 1, some of the bond pads 114 on the dies 104 and 106 are not labeled with the reference indicator 114, although all the small squares contained on each of these dies correspond to respective bond pads. The illustrated bond pads 114 on each of the dies 104 and 106 merely serve to indicate that each die includes such bond pads and the number and arrangement of such bond pads may of course vary for different types of dies.

Each bond finger 110 and corresponding external lead function to route a respective electrical signal via a corresponding bonding wire 112 to or from the memory controller die 106. In general, bond fingers 110 may route respective electrical signals to both dies 104 and 106, although in the example of FIG. 1 such signals need only be routed to the memory controller die 106 since this die functions as the interface to the DRAM die 104. These signals would include address, data, and control signals in the example of FIG. 1, as will be appreciated by those skilled in the art.

The die paddle 102 is typically metal and is typically utilized as a ground plane, meaning that the paddle is coupled through bonding wires 112 to bond fingers 110 that receive ground signals, as shown for two bond fingers 110a and 110b along the right edge of the die paddle. Any bond pads 114 on the dies 104 and 106 that are to be coupled to ground are then simply "down bonded" to the die paddle 102, meaning such bond pads are coupled directly to the die paddle via a corresponding bonding wire 112. Several examples of down bonded ground wires 112a, 112b, and 112c are shown in FIG. 1. Note that in the present description when referring generally to a plurality of the same type of component, such as bonding wires, a number descriptor will be utilized and when referring to a specific one of the plurality of components a letter designation may be appended to the number to more precisely identify a specific one of the components.

There must also be electrical interconnection between the DRAM die 104 and memory controller die 106. In the example of FIG. 1, the memory controller die 106 requires control, address, and data signal interconnections to the DRAM die 104 to transfer data to and from the DRAM die. This interconnection of signals between the dies 104 and 106 is straightforward where the bond pads 114 are positioned along edges of the two dies that are adjacent one another. In FIG. 1 this corresponds to bond pads 114a positioned along the inner edge of the DRAM die 104 and bond pads 114b positioned along the adjacent inner edge of the memory controller die 106. The bonding wires 112 in this situation are simply routed as shown from each bond pad 114a on the DRAM die 104 to a corresponding bond pad 114b on the memory controller die 106.

In addition to the bond pads 114a and 114b along the adjacent inner edges of the two dies 104 and 106, there are also typically bond pads along other edges of at least one of the dies that also require interconnection to the other die. For example, in FIG. 1 the DRAM die 104 includes three bond pads 114c, 114d, and 114e positioned along an upper edge of the DRAM die and the memory controller die 106 includes three bond pads 114f, 114g, and 114h positioned along an upper edge of the memory controller die. The bond pad 114c on the DRAM die 104 may need to be electrically connected to the bond pad 114f on the memory controller die 106.

Similarly, the bond pads 114d and 114e on the DRAM die 104 may need to be electrically interconnected to the bond pads 114g and 114h, respectively, on the memory controller die 106.

In this situation, bonding wires 112 cannot simply be utilized to interconnect the bonding pads 114c-e and 114f-h or else the bonding wires will short together or contact one another and thereby undesirably electrically interconnect multiple bond pads. This is illustrated in FIG. 1, where bonding wire 112d interconnects bond pads 114c and 114f, bonding wire 112e interconnects bond pads 114d and 114g, and bonding wire 112f interconnects bond pads 114e and 114h. These bonding wires 112d-f are likely to short-circuit or undesirably contact each other, as represented by the circle 116. Moreover, even if these bonding wires 112d-112f could initially be properly routed between the bond pads 114c-114e on die 104 and bond pads 114f-114g on die 106, subsequent manufacturing steps of the overall package or chip containing the lead frame may cause these bonding wires to short circuit. This could occur, for example, during encapsulation of the package during which an epoxy resin or other type of glue is formed over this entire structure.

The structure of a QFP package requires that bonding wires 112 be used to directly interconnect the required bond pads 114 on the two dies 104 and 106. This is in contrast to other types of packages such as ball grid arrays (BGAs) where there is an underlying substrate on which the two die 104 and 106 are mounted. This substrate functions like a miniature circuit board and simplifies the routing of the signals between the two die 104 and 106.

One approach to solving the problem of interconnecting bond pads 114 not located along the inner edges of the dies 104 and 106 is to alter the design of dies 104 and 106 so as to reposition the location of selected bond pads on the DRAM die 104 to be directly across corresponding bond pads on the memory controller die 106. Ideally, however, it is desirable that the same die 104 and 106 could be utilized whether the dies are being placed individually inside a QFP package, a ball grid array package, or any other type of package, of if they are placed inside a SIP chip. Repositioning the bond pads 114 on the dies 104 and 106 could make these die unsuitable for use individually in standard packages. Moreover, this redesign of dies 104 and 106 is relatively expensive and time consuming since it involves the cost of new mask layers used in the die fabrication process and the time it takes to fabricate new die.

Another approach for providing the required electrical interconnection of bond pads 114 not positioned along the inner edges of the dies 104 and 106 is to relocate these bond pads using a redistribution layer ("RDL"), which is a layer formed as an additive process on the top of each die. As its name implies, such a redistribution layer redistributes or repositions the locations of underlying bond pads 114 on the dies 104 and 106. With this approach, the bond pads 114f-h along the upper edge of the memory controller die 106 would be repositioned along the inner edge of this die to allow for easy connection to an adjacent bond pad 114 on the DRAM die 104 through a respective bonding wire 112. The same is true for the bond pads 114c-e along the upper edge of the DRAM die 104, with these pads being repositioned along the inner edge of this die for easy connection to corresponding bond pads on the memory controller die 106. This approach requires the design and actual physical formation of the redistribution layers on the dies 104 and 106. While this method of relocating the bond pads 114 is less expensive and faster than modifying the dies themselves, it is still undesirable. The inner edges of the dies 104 and 106 may already be fully populated with bond pads 114 thus be unable to accept new pads. This solution also requires an RDL be used on both dies 104 and 106.

Yet another approach is an interposer layer positioned under the dies 104 and 106. The interposer layer functions similar to the substrate previously described for a ball grid array to route connections for bond pads on the two dies 104 and 106, such as the bond pads 114c-e and 114f-h. Once again, this approach is relatively expensive and therefore undesirable, and also increases the vertical height of the QFP package and thereby contravenes one major advantage of a QFP package, namely the small overall height of the package. The same is true for the approach of stacking the two die 104 and 106, which also may not be practical if the size of the two die are incompatible.

There is a need in QFP or other lead frame packages that include more than one die of reliably and inexpensively electrically interconnecting the two die.

SUMMARY OF THE INVENTION

According to one aspect of the present invention, an integrated circuit includes a first and a second die positioned on a lead frame of a package. The lead frame includes a plurality of bond fingers. The integrated circuit includes a first bond pad on the first die that is electrically interconnected to a corresponding second bond pad on the second die through first and second bond fingers of the lead frame. The package may be a QFP, DIP, PLCC, TSOP, or any other type of package including a lead frame.

DETAILED DESCRIPTION OF PREFERRED EMBODIMENTS

Figure 2:
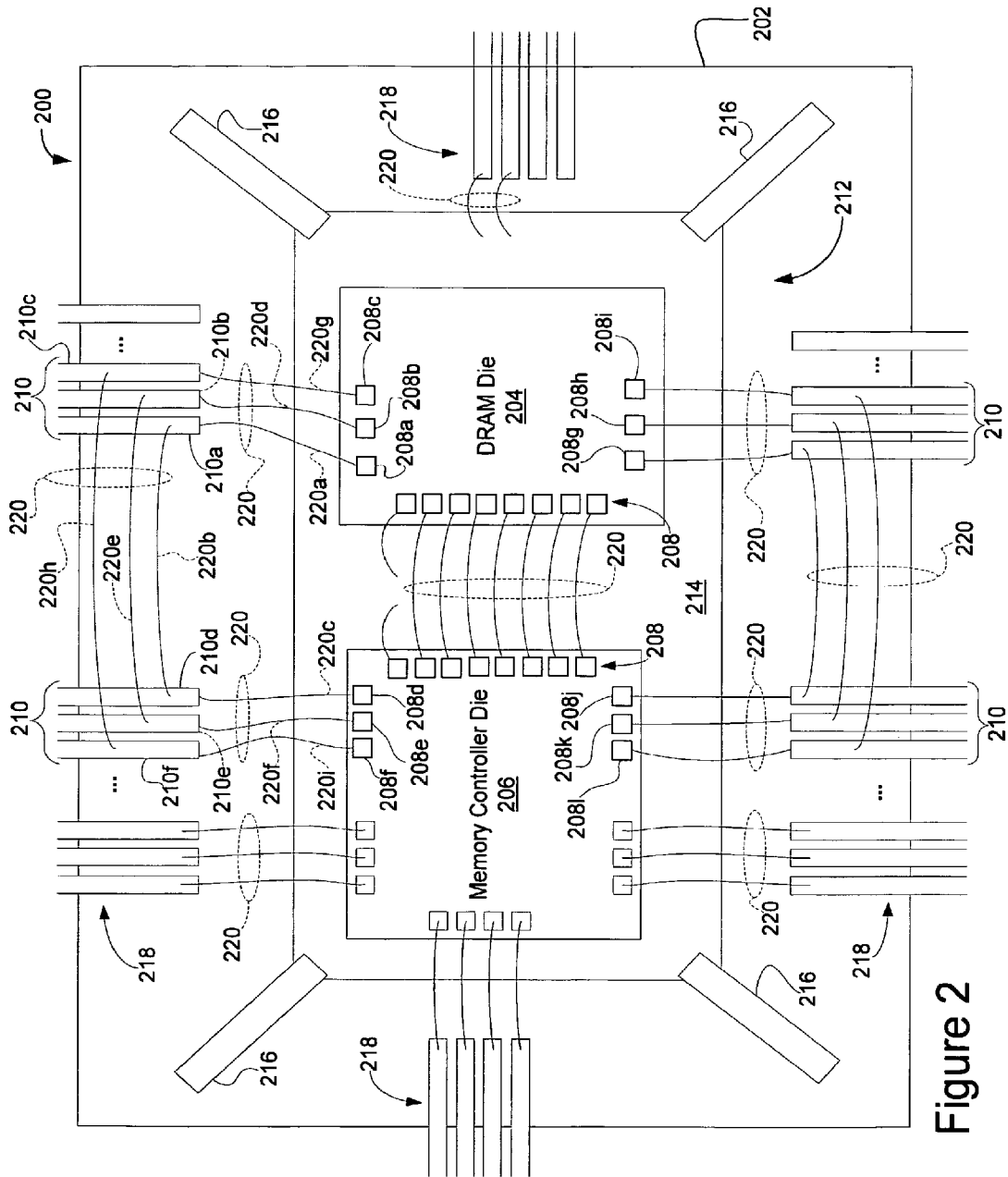
FIG. 2 is a simplified top view of a portion of a chip including a QFP package containing two die having selected bond pads interconnected through unused bond fingers in a lead frame of the package according to an embodiment of the present invention.

FIG. 2 is a simplified top view of a portion of a chip 200 including a QFP package 202 containing a DRAM die 204 and a memory controller die 206 having selected bond pads 208a-208l on these die interconnected through unused bond fingers 210 contained in a lead frame 212 of the package according to one embodiment of the present invention. More specifically, the lead frame 212 of the QFP package 202 includes bond fingers 210 that are not needed for routing signals to and from the DRAM die 204 and memory controller die 206. These bond fingers 210 are thus "extra" or "unused" bond fingers. Such unused bond fingers 210 are commonly present since the lead frame 212 comes with a predefined number of total bond fingers, such as 100, 128, 160, and so on, with this total number not exactly matching the number of electrical interconnections required for the dies 204 and 206. This embodiment of the present invention utilizes these unused bond fingers 210 to electrically interconnect bond pads 208 positioned along edges of the dies 204 and 206 other than the inner edges of these dies without the need for a redistribution layer, interposer layer, or redesign of the dies to reposition these bond pads. In this way, embodiments of the present invention simplify and reduce the cost of QFP and other lead frame type packages containing multiple dies.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

In the example of FIG. 2, the lead frame 212 includes a die paddle 214 on which the two die 204 and 206 are mounted. The die paddle 214 is supported by four tie bars or support arms 216 attached to respective corners of the die paddle. Arranged around the periphery of the die paddle 214 are the bond fingers, with the unused bond fingers 210 being referenced separately from the remaining bond fingers 218 in the lead frame 212. Several of the remaining or "used" bond fingers 218 are shown, each being coupled through a respective bonding wire 220 to a corresponding bond pad 208 on the memory controller die 206 to thereby provide required external signals to and from this die. Additional bond pads 208 positioned along the inner edge of the memory controller die 206 are connected through respective bonding wires 220 to corresponding bond pads along the inner edge of the DRAM die 204.

The die paddle 214 is grounded, meaning the paddle is coupled to receive a ground signal via respective bond fingers 218 and bonding wires 220 as shown for two such bond fingers along the right edge of the die paddle. This allows bond pads 208 on the dies 204 and 206 that are to be coupled to ground to be down bonded directly to the die paddle 214 via bonding wires 220, as shown for two bond pads 208 positioned along the inner edges of the dies 204 and 206. The die paddle 214, bond fingers 210 and 218, all bonding wires 220, and bond pads 208 are once again all formed from an electrically conductive material, such as a metal.

Figure 1:
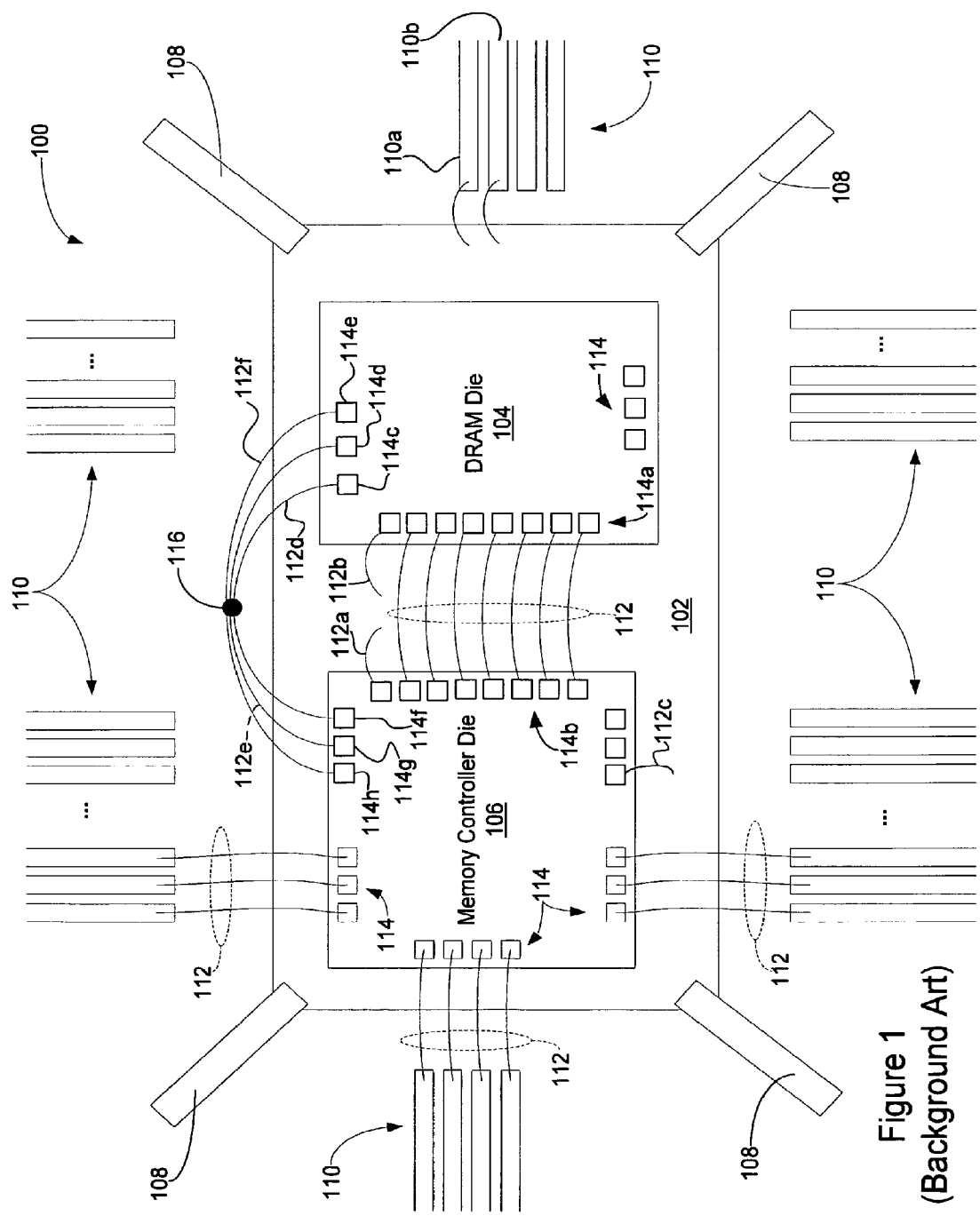
FIG. 1 is a simplified top view of a portion of a chip including a conventional QFP package containing two die and a lead frame that illustrates the problem of interconnecting certain bond pads in conventional QFP packages.

In the embodiment of FIG. 2, the DRAM die 204 includes bond pads 208*a-c* and 208*g-i* positioned along the upper and lower edges, respectively. These bond pads 208*a-c* and 208*g-i* must be electrically interconnected to corresponding bond pads 208*d-f* and 208*j-l* positioned along the upper and lower edges, respectively, of the memory controller die 206. As described with reference to FIG. 1, the interconnection of bond pads not positioned along the inner edges of the dies 204 and 206, such as the bond pads 208*a-l*, cannot be done directly through bonding wires 220 or else short circuits between such wires are likely to occur. In the embodiment of FIG. 2, unused bond fingers 210*a-f* in the lead frame 212 are used in combination with bonding wires 220 to reliably interconnect the bond pads 208*a-f* while greatly reducing the possibility of short circuits, as will now be described in more detail.

The bond pad 208*a* positioned along the upper edge of the DRAM die 204 must be electrically connected to the bond pad 208*d* positioned along the upper edge of the memory controller die 206. To form this desired electrical interconnection, the bond pad 208*a* is connected through a bonding wire 220*a* to a first unused bond finger 210*a* in the lead frame 212. The first unused bond finger 210*a* is located in a portion of the lead frame 212 adjacent the bond pad 208*a* to allow for easy interconnection of the bonding wire 220*a* between the bond pad and the unused bond finger.

The first unused bond finger 210*a* is also connected through a bonding wire 220*b* to a second unused bond finger 210*d*. The second unused bond finger 210*d* is positioned in the lead frame 212 adjacent the bond pad 208*d* on the memory controller die 206 to which the bond pad 208*a* is to be electrically connected. Finally, the second unused bond finger 210*d* is connected through a bonding wire 220*c* to the bond pad 208*d* positioned along the upper edge of the memory controller die 206. The desired electrical interconnection between the bond pad 208*a* on the DRAM die 204 and the bond pad 208*d* on the memory controller die 206 is thereby formed through the bonding wires 220*a-c* and the first and second unused bond fingers 210*a* and 210*d*.

The required electrical interconnection between the bond pad 208*b* positioned along the upper edge of the DRAM die 204 and the bond pad 208*e* positioned along the upper edge of the memory controller die 206 is formed in a similar manner. The bond pad 208*b* is connected through a bonding wire 220*d* to a first unused bond finger 210*b* in the lead frame 212. The first unused bond finger 210*b* is located in a portion of the lead frame 212 adjacent the bond pad 208*b* to allow for easy interconnection of the bonding wire 220*d* between the bond pad 208*b* and a first unused bond finger 210*b*.

The first unused bond finger 210*b* is also connected through a bonding wire 220*e* to a second unused bond finger 210*e*. The second unused bond finger 210*e* is positioned in the lead frame 212 adjacent the bond pad 208*e* on the memory controller die 206 to which the bond pad 208*b* is to be electrically connected. Finally, the second unused bond finger 210*e* is connected through a bonding wire 220*f* to the bond pad 208*e* positioned along the upper edge of the memory controller die 206. The desired electrical interconnection between the bond pad 208*b* on the DRAM die 204 and the bond pad 208*e* on the memory controller die 206 is formed through the bonding wires 220*d-f* and the first and second unused bond fingers 210*b* and 210*e*.

The required electrical interconnection between the bond pad 208*c* positioned along the upper edge of the DRAM die 204 and the bond pad 208*f* positioned along the upper edge of the memory controller die 206 is formed in a similar manner through bonding wires 220*g*, 220*h*, and 220*i* and unused bond fingers 210*c* and 210*f* as shown. Required electrical interconnections between the bond pads 208*g-i* positioned along the lower edge of the DRAM die 204 and bond pads 208*j-l* positioned along the lower edge of the memory controller die 206 are formed in the same way and thus will not be described in more detail.

The use of the unused bond fingers 210 in the lead frame 212 allows for the required electrical interconnections between bond pads 208*a-c* and 208*g-i* on the DRAM die 204 and the bond pads 208*d-f* and 208*j-l* on the memory controller die 206. The same is true for bond pads 208 positioned anywhere on the dies 204 and 206. Bond pads 208 positioned along the inner edges of the dies 204 and 206 may be directly connected through bonding wires 220 as shown, but bond pads located anywhere else on these dies may also be interconnected through bonding wires 220 and unused bond fingers 210 of the lead frame 212. To make the desired electrical interconnection, a first unused bond finger 210 is defined adjacent the selected bond pad 208 on the DRAM die 204. The bond pad 208 and this first unused bond finger 210 are then interconnected through a bonding wire 220. A second unused bond finger 210 is defined adjacent the selected bond pad 208 on the memory controller 206. This bond pad 208 is then interconnected through a corresponding bonding wire 220. Finally, the first and second unused bond fingers 210 are then interconnected through a corresponding bonding wire 222 complete the desired interconnection between the bond pads 208 on the dies 204 and 206.

In some situations, additional unused bond fingers 210 and bonding wires 220 may be utilized to form desired electrical interconnections between bond pads 208 on the DRAM die 204 end of the memory controller die 206. For example, assume the bond pad 208c is positioned not along the upper edge of the DRAM die 204 but instead along the right edge of the DRAM die 204. The bond pad 208c may in this situation still be connected to the bond pad 208f on the memory controller die 206. To form this desired interconnection, a first unused bond finger 210 adjacent the bond pad 208c along the right edge of the DRAM die 204 would be selected and interconnected to the bond pad through a corresponding bonding wire 220. This first unused bond finger could then be interconnected through a corresponding bonding wire 220 to the unused bond finger 210c positioned along the upper edge of the lead frame 212 as shown and as previously discussed. The bond finger 210c is then interconnected through the bonding wire 220h, unused bond finger 210f, and bonding wire 220i to the bond pad 208f on the die 206. In some situations, a series of unused bond fingers 210 positioned along the edges of the lead frame 212 could be used to provide the required interconnection. For example, in the last example additional unused bond fingers 210 along the right and upper edges of the lead frame 212 may be utilized in a sort of daisy chain to electrically interconnect the bond pad 208c positioned in this example along the right edge of the DRAM die 204 to the unused bond finger 210c along the upper edge of the lead frame.

Figure 3:
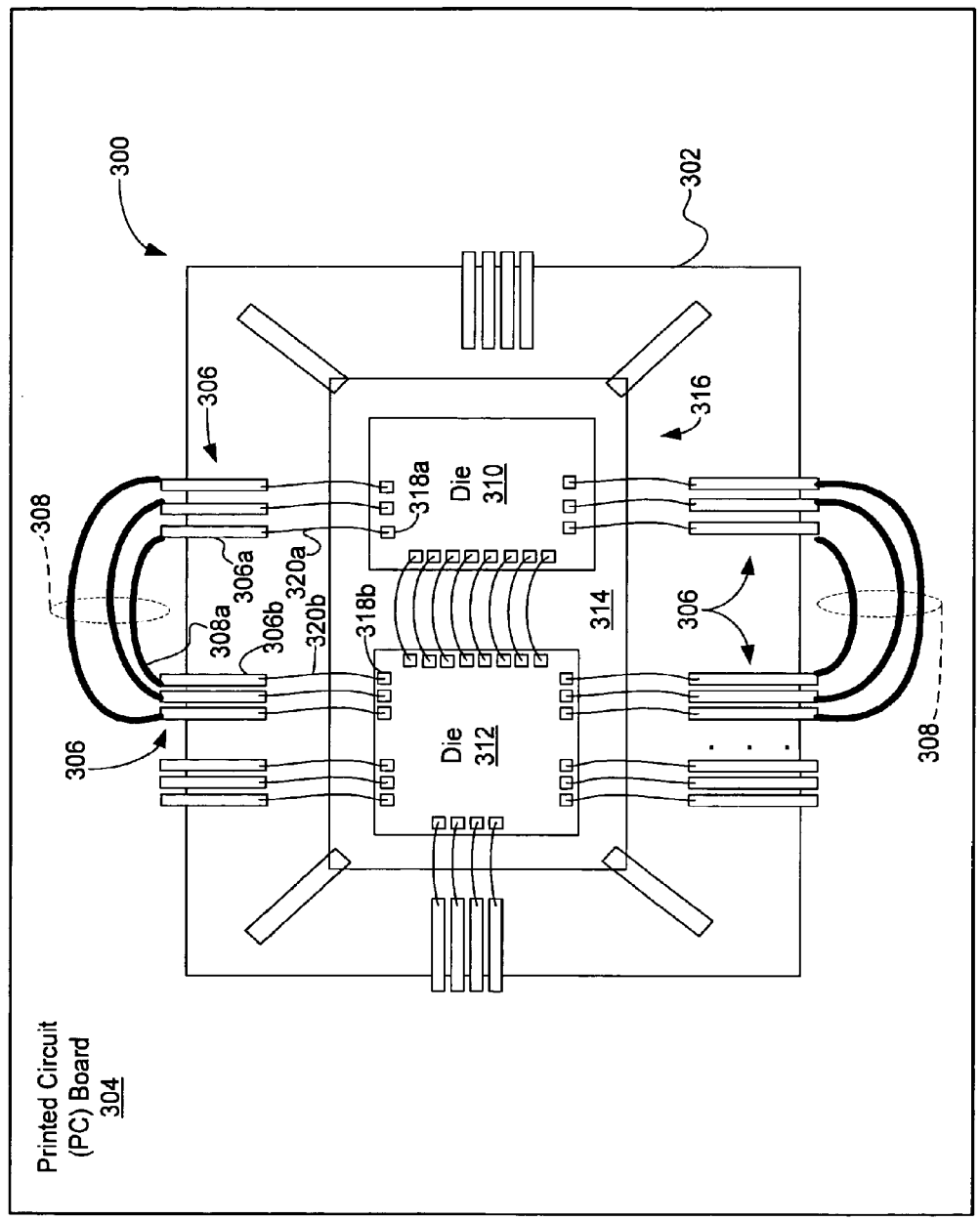
FIG. 3 is a simplified top view of a portion of a chip including a QFP package mounted on a printed circuit board in which unused bond fingers of FIG. 2 are interconnected external to the package through conductive traces on the printed circuit board according to another embodiment of the present invention.

FIG. 3 is a simplified top view of a portion of a chip 300 including a QFP package 302 mounted on a printed circuit board 304 in which unused bond fingers 306 are interconnected external to the package through conductive traces 308 on the printed circuit board according to another embodiment of the present invention. The chip 300 includes two dies 310 and 312 mounted on a die paddle 314 of a lead frame 316 of the package 302. This embodiment is similar to that of FIG. 2 except for the use of the external conductive traces 308 to interconnect the unused bond fingers 306 that are connected to bond pads 318 on the two dies 310 and 312. For example, a bond pad 318a on the die 310 is connected through a bonding wire 320a to a first unused bond finger 306a. The first unused bond finger 306a is electrically interconnected through a conductive trace 308a on the printed circuit board 304 to a second unused bond finger 306b which, in turn, is connected through a bonding wire 320b to a bond pad 318b on the second die 312. This embodiment reduces the number of bonding wires 320 that must be formed within the package 302, which may be advantageous in certain applications. The conductive traces 308 on the printed circuit board 304 also could be much larger than the bonding wires 320, which may be advantageous in situations where the resistance of the interconnection must be minimized.

Although the embodiments of FIGS. 2 and 3 are discussed with reference to QFP packages, the present invention is not limited to such packages. Other embodiments of the present invention may be applied to any type of package including a lead frame, such as the previously mentioned DIP, PLCC, TSOP, and QFP type packages. Also note that in other embodiments of the invention the QFP package includes more than two die, with these die having bonding pads that are interconnected through unused bond fingers in the lead frame in the same way as described in the embodiment of FIG. 2 and/or FIG. 3.

One skilled in the art will realize that any type and number of dies may be contained in a QFP package according to embodiments of the invention, with the number of dies not being limited to two and types of dies not being limited to the memory controller 206 and DRAM die 204 in the example embodiments of FIGS. 2 and 3. The specific types and number of dies contained in the QFP package will determine the specific nature the interconnection of the dies to bond fingers to interface with external signals and the use of unused bond fingers to electrically interconnect specific bond pads on the dies together. Furthermore, more than a single pair of unused bond fingers could be used in interconnecting a single pair of bond pads on different die, with the additional bond fingers and associated bonding wires being coupled in series between the pair of bond pads.

Figure 4:
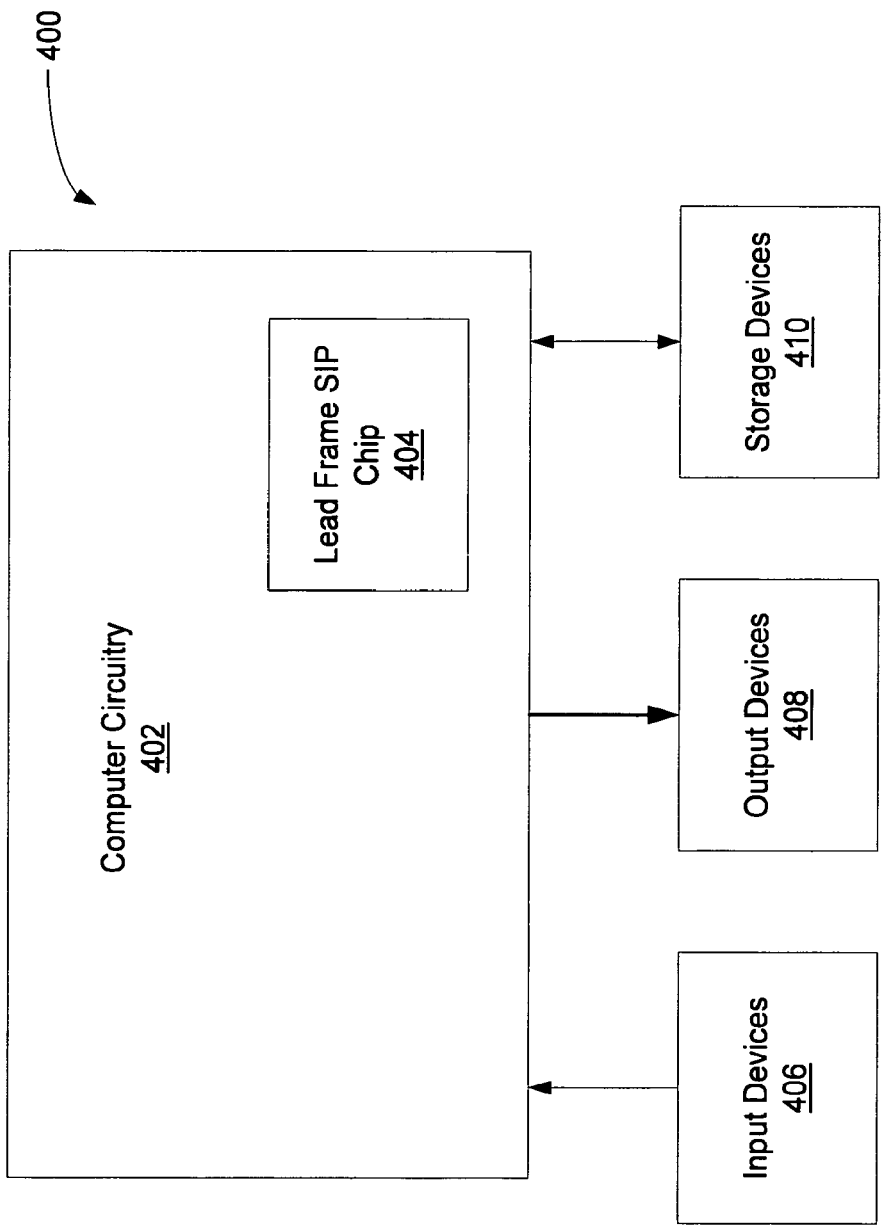
FIG. 4 is a functional block diagram of a computer system including a QFP chip containing die having bond pads interconnected as in the embodiment of FIG. 2 and/or FIG. 3 according to another embodiment of the present invention.

FIG. 4 is a functional block diagram of a computer system 400 including computer circuitry 402 containing a lead frame SIP integrated circuit or chip 404 including two or more die (not shown) having at least some interconnections via unused bond fingers (not shown) as described with reference to the embodiments of FIG. 2 and/or FIG. 3. Any types of dies (not shown) may be contained in the SIP chip 404, with the specific dies depending on the required function of the chip. The SIP chip 404 is not limited to including only the DRAM and memory controller dies discussed with reference to the example embodiments of FIGS. 2 and 3, as previously mentioned.

The computer circuitry 402 is coupled through suitable address, data, and control buses to the SIP chip 404 to provide for writing data to and reading data from the chip as well as for controlling the chip. The computer circuitry 402 includes circuitry for performing various computing functions, such as executing specific software to perform specific calculations or tasks. In addition, the computer system 400 includes one or more input devices 406, such as a keyboard or a mouse, coupled to the computer circuitry 402 to allow an operator to interface with the computer system. Typically, the computer system 400 also includes one or more output devices 408 coupled to the computer circuitry 402, such as output devices typically including a printer and a video terminal. One or more data storage devices 410 are also typically coupled to the computer circuitry 402 to store data or retrieve data from external storage media (not shown). Examples of typical storage devices 410 include hard and floppy disks, flash cards, compact disk read-only (CD-ROMs) and compact disk read-write (CD-RW) memories, and digital video disks (DVDs). The term computer system 400 is used broadly to include any type of electronic system in which the SIP chip 404 may be contained, and thus includes personal and server computer systems, portable electronic devices like cellular phones and personal digital assistants, communications systems, printer systems, and so on.

Even though various embodiments and advantages of the present invention have been set forth in the foregoing description, the above disclosure is illustrative only, and changes may be made in detail and yet remain within the broad principles of the present invention. Moreover, the functions performed by some elements may in some embodiments be combined to be performed by fewer elements, separated and performed by more elements, as will be appreciated by those skilled in the art. Therefore, the present invention is to be limited only by the appended claims.

What is claimed is:

1. A method of routing signals within an integrated circuit, the integrated circuit comprising a first die and a second die each positioned on a lead frame of a package, the method comprising:
   routing a signal from a first bond pad to a first bond finger of a first set of bond fingers in the lead frame, the first bond pad being located on the first die;
   routing the signal from the first bond finger of the first set of bond fingers to a first bond finger of a second set of bond fingers in the lead frame; and
   routing the signal from the first bond finger of the second set of bond fingers to a second bond pad, the second bond pad being located on the second die;
   wherein the first set of bond fingers is configured to only route signals internal to the integrated circuit.

2. The method of claim 1, further comprising:
   routing a signal from a second bond finger of the first set of bond fingers in the lead frame to a second bond finger of the second set of bond fingers in the lead frame;
   wherein the second set of bond fingers is configured to only route signals external to the integrated circuit.

3. The method of claim 1, wherein routing a signal from the first bond pad to the first bond finger of the first set of bond fingers in the lead frame comprises coupling a bonding wire between i) the first bond pad and ii) the first bond finger of the first set of bond fingers.

4. The method of claim 3, wherein routing the signal from the first bond finger of the second set of bond fingers to the second bond pad comprises connecting a bonding wire between i) the first bond finger of the second set of bond fingers and ii) the second bond pad.

5. The method of claim 1, wherein the signal comprises an address signal, a data signal, or a control signal.

6. The method of claim 1, wherein the package comprises a quad-flat package (QFP).

7. The method of claim 1, wherein the first die is a dynamic random access memory (DRAM).

8. The method of claim 1, wherein the second die is a memory controller.

9. The method of claim 1, wherein the lead frame of the package includes a die paddle supported by four tie bars attached to respective corners of the die paddle.

10. The method of claim 1, wherein the lead frame of the package comprises a die paddle, and the first die and the second die are each mounted to the die paddle.

11. The method of claim 1, wherein:
   each of the first die and the second die have respective inner edges that are adjacent to one another;
   the first bond pad is positioned along one of an upper, a lower, and an outer edge of the first die; and
   the second bond pad is positioned along one of an upper, a lower, and an outer edge of the second die.

12. The method of claim 11, wherein:
   the first bond pad is positioned along one of the upper, the lower, and the outer edge of the first die;
   the second bond pad is positioned along a different one of the upper, the lower, and the outer edge of the second die; and
   the first bond finger of the first set of bond fingers is electrically connected to a first bond finger of a second set of bond fingers through a conductive trace external to the package.

* * * * *